US009025883B2

(12) United States Patent
Bernal et al.

(10) Patent No.: US 9,025,883 B2
(45) Date of Patent: May 5, 2015

(54) ADAPTIVE QUALITY IMAGE RECONSTRUCTION VIA A COMPRESSED SENSING FRAMEWORK

(71) Applicant: Xerox Corporation, Norwalk, CT (US)

(72) Inventors: Edgar A. Bernal, Webster, NY (US); Xuejin Wen, Fairport, NY (US); Wencheng Wu, Webster, NY (US); Lalit Keshav Mestha, Fairport, NY (US)

(73) Assignee: Xerox Corporation, Norwalk, CT (US)

( * ) Notice: Subject to any disclaimer, the term of this patent is extended or adjusted under 35 U.S.C. 154(b) by 14 days.

(21) Appl. No.: 14/085,143

(22) Filed: Nov. 20, 2013

(65) Prior Publication Data

US 2015/0003738 A1    Jan. 1, 2015

Related U.S. Application Data

(63) Continuation-in-part of application No. 13/932,791, filed on Jul. 1, 2013.

(51) Int. Cl.
*G06K 9/46* (2006.01)
*G06T 11/00* (2006.01)
*G06K 9/32* (2006.01)

(52) U.S. Cl.
CPC ............ *G06T 11/003* (2013.01); *G06K 9/3233* (2013.01)

(58) Field of Classification Search
CPC .......................... G06K 9/3233; G06T 11/003
USPC ................. 382/195, 105, 112, 171, 210, 211, 382/121–127
See application file for complete search history.

(56) References Cited

U.S. PATENT DOCUMENTS

2014/0152986 A1* 6/2014 Trainer .......................... 356/336

OTHER PUBLICATIONS

Bauchert et al., "Advances in liquid crystal spatial light modulators", Society of Photo Instrumentation Engineers, 2002.
Candes, Emmanuel J., "Compressive sampling", Proceedings of the International Congress of Mathematicians, Madrid, Spain, 2006.
Candes et al., "Robust Uncertainty Principles: Exact Signal Reconstruction from Highly Incomplete Frequency Information", Jun. 2004.
Dudley et al., "Emerging Digital Micromirror Device (DMD) Applications", Society of Photo-Optical Instrumentation Engineers, 2003.
In-View Technology Corporation, "CS Camera Technology How a Compressive Sensing Camera Works", 2013.
Jenoptik, "Liquid Crystal Spatial Light Modulators", Aug. 2012.

(Continued)

*Primary Examiner* — Mike Rahmjoo
(74) *Attorney, Agent, or Firm* — Philip E. Blair; Fleit Gibbons Gutman Bongini & Bianco P.L.

(57) ABSTRACT

What is disclosed is a system and method which reconstructs an N-pixel image of a scene such that Q pixel locations associated with identified regions of interest in a scene have a higher image quality when rendered relative to other pixels in the image. Acquisition and adaptive-quality compression are performed simultaneously by semi-synchronously or asynchronously temporally modulating an ordered set of sampling functions used to spatially modulate a pattern of light. The teachings hereof improve compression efficiency of a compressed sensing framework while improving encoding efficiency with respect to traditional compressed sensing techniques.

25 Claims, 4 Drawing Sheets

(56) References Cited

OTHER PUBLICATIONS

"Li et al., Visual attention guided bit allocation in video compression", Image and Vision Computing 29, 2011.
Robucci et al., "Compressive Sensing on a CMOS Separable-Transform Image Sensor", Proceedings on IEEE, Apr. 22, 2009.
Wen et al., "Low Bit-Rate Video Streaming for Face-To-Face Teleconference", Proceedings on IEEE, 2004.
Batlle et al., "Recent Progess in Coded Structured Light as a Technique to Solve the Correspondence Problem: A Survey", Pattern Recognition, vol. 31, No. 7, 1998, pp. 963-982.

* cited by examiner

|  | TRADITIONAL | | B=2 | | B=3 | | B=4 | |
|---|---|---|---|---|---|---|---|---|
| # OF SAMPLES | MSE ROI | MSE OVERALL | MSE ROI | MSE OVERALL | MSE ROI | MSE OVERALL | MSE ROI | MSE OVERALL |
| 512 | 95.91 | 87.21 | 82.88 | 86.15 | 82.47 | 97.54 | 82.96 | 92.68 |
| 1024 | 15.01 | 15.24 | 13.39 | 15.53 | 14.99 | 18.35 | 15.68 | 19.01 |
| 1536 | 3.26 | 3.19 | 2.93 | 3.21 | 2.74 | 3.44 | 2.35 | 3.42 |
| 2048 | 1.06 | 1.02 | 0.92 | 1.00 | 0.96 | 1.12 | 0.77 | 1.06 |
| 2560 | 0.35 | 0.32 | 0.29 | 0.32 | 0.26 | 0.36 | 0.21 | 0.33 |
| 3072 | 0.09 | 0.08 | 0.07 | 0.08 | 0.06 | 0.09 | 0.05 | 0.08 |

|  | B=5 | | B=6 | | B=7 | | B=8 | |
|---|---|---|---|---|---|---|---|---|
| # OF SAMPLES | MSE ROI | MSE OVERALL | MSE ROI | MSE OVERALL | MSE ROI | MSE OVERALL | MSE ROI | MSE OVERALL |
| 512 | 72.68 | 91.82 | 70.92 | 92.56 | 73.89 | 98.43 | 74.76 | 104.92 |
| 1024 | 12.24 | 16.25 | 12.91 | 18.70 | 11.33 | 16.72 | 11.03 | 15.77 |
| 1536 | 2.74 | 4.22 | 2.92 | 4.53 | 2.67 | 4.37 | 2.56 | 4.50 |
| 2048 | 0.68 | 1.06 | 0.74 | 1.18 | 0.64 | 1.08 | 0.67 | 1.08 |
| 2560 | 0.20 | 0.38 | 0.22 | 0.39 | 0.20 | 0.39 | 0.18 | 0.39 |
| 3072 | 0.04 | 0.09 | 0.05 | 0.11 | 0.05 | 0.11 | 0.04 | 0.11 |

FIG. 4

ADAPTIVE QUALITY IMAGE RECONSTRUCTION VIA A COMPRESSED SENSING FRAMEWORK

CROSS REFERENCE TO RELATED APPLICATIONS

This patent application is a continuation-in-part of commonly owned and co-pending U.S. patent application Ser. No. 13/932,791, entitled: "Reconstructing An Image Of A Scene Captured Using A Compressed Sensing Device", by Bernal et al.

TECHNICAL FIELD

The present invention is directed to systems and methods which use a compressed sensing framework to reconstruct an image of a scene wherein pixel locations associated with identified regions of interest in that scene have a higher image quality when rendered relative to other pixels of the reconstructed image.

BACKGROUND

Compressed sensing is a relatively new area in the signal processing art where one measures a small number of non-adaptive linear combinations of a signal. These measurements are usually much smaller than the number of samples that define the signal. From the small numbers of measurements, the signal is reconstructed by a non-linear process which aims to reduce the overall complexity required by a large variety of measurement systems by introducing signal compression into the measurement process. Essentially, the theory behind compressed sensing is that sparse signal statistics can be recovered from a small number of measurements. The sparse nature of most signals of interest allows high-fidelity reconstructions to be made using a compressed sensing approach. Compressed sensing can be beneficial because it reduces the number of samples required to spatially and/or temporally reconstruct a given scene thereby enabling the use of inexpensive sensors with reduced spatial and/or temporal resolution in certain applications where complex sensors are otherwise used, while maintaining the quality of the reconstructed image of the scene. Compressed sensing also holds an advantage in fidelity over conventional camera systems due to detector noise issues that may affect measurements due to the limited radiometric efficiency of pixels in two-dimensional sensors. The present application provides a desirable extension to the prior compressed sensing system taught by Bernal et al.

BRIEF SUMMARY

What is disclosed is a system and method which reconstructs an N-pixel image of a scene such that Q pixel locations associated with identified regions of interest in a scene have a higher image quality when rendered relative to other pixels in the image. Acquisition and adaptive-quality compression are performed simultaneously by semi-synchronously or asynchronously modulating temporally an ordered set of sampling functions, used to spatially modulate light incoming from the scene. The teachings hereof improve compression efficiency of a compressed sensing framework. Encoding efficiency is improved with respect to traditional compressed sensing techniques.

In the context of the following discussion, bold Greek letters refer to sets of functions of a given length and to matrices formed by stacking rows, where each row is a function in the set.

In one embodiment, the present method for reconstructing an N-pixel image of a scene captured using a compressed sensing device involves performing the following. First, a mask is received which identifies at least one region of interest (ROI) in a scene having Q pixels, where Q<N. The mask can be a binary image wherein pixels with value '1' (ON pixels) indicate locations associated with the ROI and pixels with value '0' (OFF pixels) indicate locations not associated with the ROI. Consequently, the mask has at least Q ON pixels, and at most N−Q OFF pixels. The mask can also be multi-level, each level corresponding to one identified ROI, each identified ROI potentially having a different quality of reconstruction assigned to it. Next, a set of M sampling functions is arranged in an M×N matrix $\phi = \{\phi_1, \ldots, \phi_M\}$, whose $m^{th}$ row vector $\phi_m \in \mathbb{R}^N$ denotes the $m^{th}$ N-dimensional sampling function, and where M<<N. The set of sampling functions is then partitioned into K non-overlapping and non-empty subsets of sampling functions $\{\phi_1, \ldots, \phi_{M1}\}$, $\{\phi_{M1+1}, \ldots, \phi_{M1+M2}\}, \ldots, \{\phi_{M-Mk+1}, \ldots, \phi_M\}$ each having $M_i$ elements, where $1 \leq i \leq K$ and $M_1+M_2+\ldots+M_k=M$. Each of the resulting subset of functions are next arranged in $M_i \times N$ matrices $\phi_1, \phi_2, \ldots, \phi_K$. Each matrix has at least Q linearly independent columns and at most N−Q linearly dependent columns. An index of the linearly independent columns is associated with locations corresponding to the ROIs, and an index of the linearly dependent columns is associated with locations which do not correspond to the ROIs. Thereafter, incoming light is modulated by a spatial light modulator according to a plurality of spatial patterns corresponding to the ordered sampling functions. The light reflected/transmitted off the modulator is focused onto a detector of a compressed sensing device. The detector proceeds to sample sequential measurements of the light focused thereon. The measurements comprise a sequence of projection coefficients corresponding to a scene. Each of the sampled measurements are an inner product result $y_m = \langle x, \phi_m \rangle$, where x denotes an N-dimensional vector representing an N-pixel sampled version of a scene. Thereafter, a spatial appearance of the scene is reconstructed from the sequence of projection coefficients after M inner products have been sampled. The reconstructed image being such that pixels associated with the ROIs have a higher image quality when rendered relative to other pixels in the image.

Features and advantages of the above-described system and method will become readily apparent from the following detailed description and accompanying drawings.

BRIEF DESCRIPTION OF THE DRAWINGS

The foregoing and other features and advantages of the subject matter disclosed herein will be made apparent from the following detailed description taken in conjunction with the accompanying drawings, in which:

FIG. 4 is a table of results illustrating quality of reconstruction as measured by the mean squared error (MSE) from having reconstructed an image with varying number of samples using the present method, as well as the traditional compressed sensing approach.

DETAILED DESCRIPTION

Figure 1:
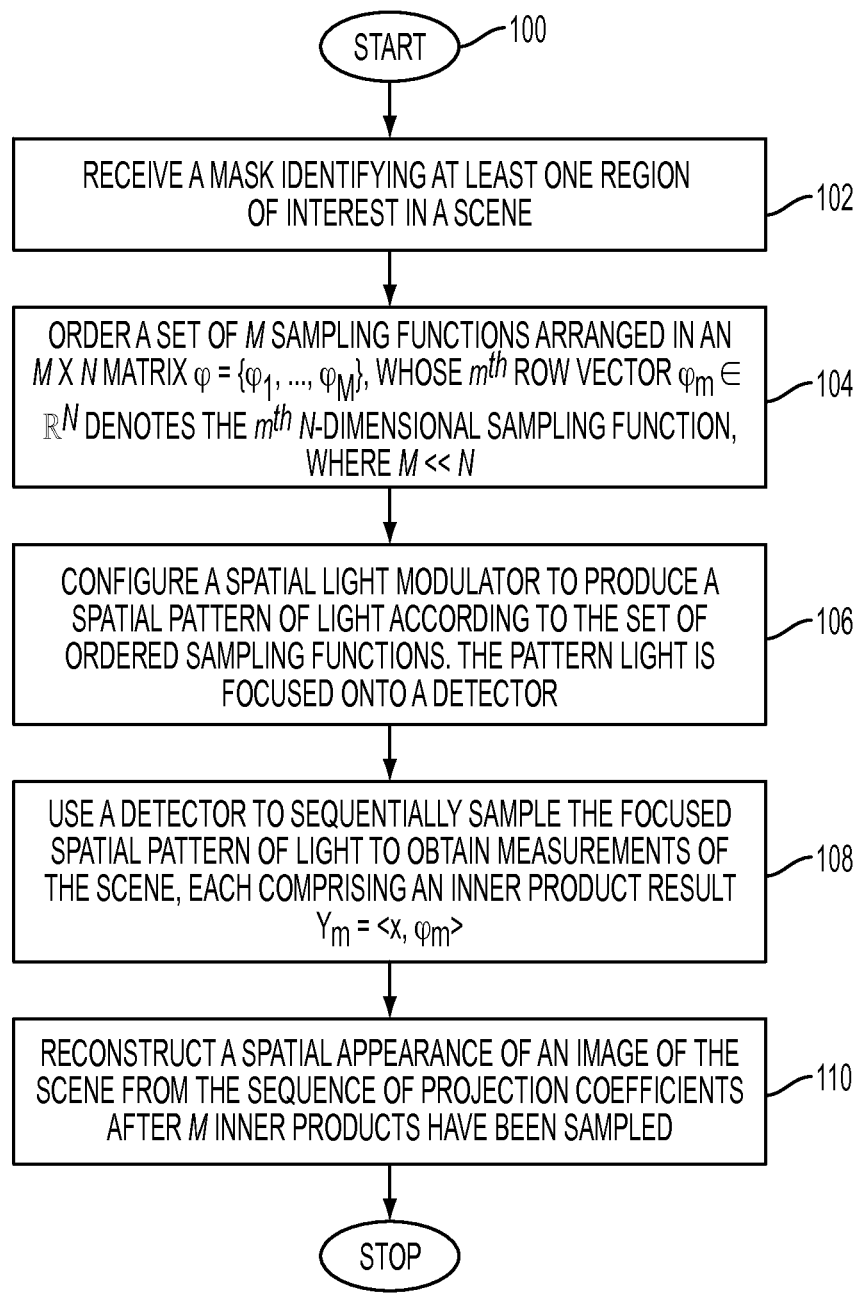
FIG. 1 illustrates one example embodiment of the present method for reconstructing an image of a scene.

What is disclosed is a system and method which reconstructs an N-pixel image of a scene such that Q pixel locations associated with identified regions of interest in a scene have a higher image quality when rendered relative to other pixels in the image.

NON-LIMITING DEFINITIONS

A "region of interest" (ROI) is an identified area of a scene intended to be reconstructed using the teachings disclosed herein with a higher quality relative to other areas of that scene. What defines a particular region of interest will largely depend on the application where the present invention finds its uses. The image of the scene from which a region of interest is first identified can be acquired with the compressed sensing device following the traditional compressed sensing framework. Alternatively, it can be acquired with a traditional imaging device having a significantly similar view point of the scene relative to the compressed sensing device. In yet another embodiment, the image of the scene can be received from an existing database of images. A region of interest is then identified from the image of the scene. Regions of interest can be identified by processing an image of the scene to identify using any of: pixel classification, object identification, facial recognition, color, texture, spatial features, spectral information, pattern recognition, motion detection, foreground detection, and a user input. The location, shape or size of the identified region of interest can change over time. Once a region of interest has been identified, changes in the location of the identified region of interest can be identified by tracking techniques. Alternatively, re-identification of the region of interest pixel classification, object identification, facial recognition, color, texture, spatial features, spectral information, pattern recognition, motion detection, foreground detection, and a user input can be performed periodically.

A "photodetector" or simply "detector" is a device which measures a magnitude of an intensity of light focused thereon. In various embodiments, the photodetector can be a single (diode) detector or a multi-diode detector and may further comprise an analog-to-digital converter and an amplifier.

A "Spatial Light Modulator (SLM)" is a device in the compressed sensing device positioned along an optical axis where a camera's focal plane array would typically be located. The SLM is controllable such that it can be configured according to spatial patterns which can be used to modulate incoming light which can then be transmitted or reflected onto a photodetector of a compressed sensing device. As mentioned earlier, a compressed sensing device relies on modulating incoming light from the scene by a spatial light modulator according to a plurality of spatial patterns. Examples of spatial light modulators include, but are not limited to Digital Micromirror Devices, Transmissive Liquid Crystals and Liquid Crystals on Silicon.

"Digital Micromirror Device (DMD)" is an optical microelectromechanical (MEMS) device which has, on its surface, imaging elements comprising microscopic opto-mechanical mirrors arrayed on a two-dimensional grid. Each mirror in the array is referred to as a DMD pixel. The microscopic mirrors are electronically controllable and thus modulate incoming light by toggling a reflectivity thereof by individually tilting (or rotating) the mirrors in one direction or another to achieve an ON/OFF state. In the ON state, light is reflected in a desired direction, such as through a lens or onto a photodetector. In the OFF state, the light is directed elsewhere. By convention, the positive (+) state is ON and the negative (−) state is OFF. The two states are opposites, i.e., if one element is '1' then the other is '0', and vice versa. As prescribed by compressed sensing theory, each DMD pattern is configured to select a defined portion of the incoming light onto a detector. During image acquisition, a series of unique patterns are sequentially provided to the DMD and a series of measurements are obtained. Light energy is reflected by the DMD mirrors onto the photo diode or photoreceptor where the photons of the image are converted to an electrical signal. Each signal, produced as a result of each measurement, is a function of a specific pattern and of the scene. By rapidly changing the DMD patterns and obtaining measurements therefrom, a time-series signal is obtained. Utilizing a compressed sensing framework, an image reconstruction algorithm reconstructs the original image from the generated time-series measurement data with knowledge of the temporal sequence of patterns. DMDs are available from vendors in various streams of commerce.

A "Transmissive Liquid Crystal (TLC)" also referred to a "Liquid Crystal Modulator (LCM)", is a programmable array of liquid crystal elements. Each liquid crystal element in the array is a pixel. The liquid crystal elements are individually electronically controllable and thus the TLC modulates incoming light by toggling a transparency of each TLC pixel to achieve an ON/OFF state. By convention, in the ON state, the liquid crystal element is transparent so light passes therethrough. In the OFF state, the liquid crystal element is opaque so light does not pass therethrough. TLCs are desirable in many applications because of their fast switching times and a high degree of usability over a broad range of visible to infrared wavelength bands. TLCs are available from vendors in various streams of commerce.

A reflective "Liquid Crystal on Silicon (LCoS)" refers to a micro-projection or micro-display technology which uses liquid crystals instead of individual mirrors. In LCoS, liquid crystals are applied directly to the surface of a silicon chip coated with an aluminized layer with some type of passivation layer, which is highly reflective. LCoS technology is preferable in many applications because it can produce higher resolution and higher contrast images than standard liquid crystal technologies.

A "compressed sensing framework" is a signal processing technique for reconstructing a signal with solutions found by taking advantage of the signal's sparseness or compressibility in some domain, thereby enabling the entire signal to be generated from relatively few measurements. An underdetermined linear system has more unknowns than equations and generally has an infinite number of solutions. In order to choose a proper solution, constraints are applied. Because many signals are sparse, i.e., they contain many coefficients close to or equal to zero when represented in some domain, the additional constraint of sparsity allows only those solutions with a small number of non-zero coefficients to be considered as feasible. Not all underdetermined systems have a sparse solution. However, if there is a unique sparse representation to that underdetermined linear system then a compressed sensing framework enables a recovery of that solution.

"Correlation" between two functions $\phi, \Phi \in \mathbb{R}^N$ is defined as the magnitude or absolute value of their inner product $|\langle \phi, \Phi \rangle|$, where the inner product $\langle \phi, \Phi \rangle$ is obtained by performing N element-wise multiplication and adding the N individual results into a single number. Two functions are said to be "largely uncorrelated" if there exists a real number $T_1$ such that $|\langle \phi,\Phi \rangle| \leq T_1$. The choice for $T_1$ is usually application-dependent and is expressed in terms of N and of the value P that bounds $\Phi$ and $\phi$, where P is such that $|\Phi(k)| \leq P$ and $|\phi(k)| \leq P$, for all k. For example, in one application, two functions are considered to be largely uncorrelated if $T_1=0.1NP^2$. Two functions are said to be "largely correlated" if there exists a real number $T_1'$ such that $|\langle \phi,\Phi \rangle| \geq T_1'$. For example, in one application, two functions are considered to be largely uncorrelated if $T_1'=0.9NP^2$. In the context of the present disclosure, a level of correlation between two functions is indicative of a level of co-linearity: the larger the correlation between two functions, the more collinear they are.

"Coherence" between two sets of functions $\Phi$ and $\phi$, where $\Phi=\{\Phi_1, \ldots, \Phi_{M1}\}$ with $\Phi_i \in \mathbb{R}^N$ for all i, and $\phi=\{\phi_1, \ldots, \phi_{M2}\}$ with $\phi_j \in \mathbb{R}^N$ for all j is defined as: $\mu(\Phi, \phi)=\sqrt{N}\max_{1 \leq i \leq M1, 1 \leq j \leq M2}\{|\langle \Phi_i, \phi_j \rangle|\}$. Two sets of functions $\Phi$ and $\phi$ are said to be "largely incoherent" if there exists a real number $T_2$ such that $\mu(\Phi, \phi) \leq T_2$. The choice for $T_2$ is usually application-dependent and is expressed in terms of N and of the range of values of the functions $\Phi_i$ and $\phi_j$ in $\Phi$ and $\phi$, P. For example, in one application, two sets are considered to be largely incoherent for $T_2=0.2NP^2$.

Flow Diagram of One Embodiment

Reference is now being made to the flow diagram of FIG. 1 which illustrates one example embodiment of the present method for reconstructing an image of a scene captured using a compressed sensing device with the teachings hereof wherein Q pixel locations associated with identified regions of interest in the scene have a higher image quality when rendered relative to other pixels in the image. Flow processing begins at step 100 and immediately proceeds to step 102.

At step 102, receive a mask identifying at least one region of interest (ROI) in a scene. The mask can be dynamically updated in response to a new region of interest having been identified, a location of a region of interest changing in a scene, or a user input. The mask may be received from a remote device over a network via a wired or wireless pathway, or retrieved from a storage device such as a memory or a hard drive. The mask can be a binary image wherein pixels with value '1' (ON pixels) indicate locations associated with the ROI and pixels with value '0' (OFF pixels) indicate locations not associated with the ROI. The mask can also be multi-level, each level corresponding to one identified ROI.

At step 104, order a set of M sampling functions arranged in an M×N matrix $\phi=\{\phi_1, \ldots, \phi_M\}$, whose $m^{th}$ row vector $\phi_m \in \mathbb{R}^N$ denotes the $m^{th}$ N-dimensional sampling function, where M<<N. The index m is indicative of an ordering of the function in a sampling sequence. The ordering is such that, given a block length B, partitions of the set $\phi$ into non-overlapping and non-empty subsets define sub-matrices $\phi_1, \phi_2, \ldots, \phi_{\lceil M/B \rceil}$ all except possibly one of size B×N (where $\lceil \bullet \rceil$ denotes the ceiling operator which maps a real number to a smallest following integer) corresponding to sequences of functions arranged in subsets all except possibly one of length B, $\{\phi_1, \ldots, \phi_B\}, \{\phi_{B+1}, \ldots, \phi_{2B}\}, \ldots, \{\phi_{B\lceil M/B \rceil-B+1}, \ldots, \phi_M\}$, respectively, where B<M is the block length. Each resulting sub-matrix has at least Q linearly independent columns and at most N−Q dependent columns. It should be appreciated that the word "possibly" is used here because either all are of size B×N or all but one are of size B×N.

Other partitions of the original set into $$\left\lceil \frac{M}{B} \right\rceil$$

subsets, all except one of length B may be utilized. For example, the partition $\{\phi_1, \ldots, \phi_B\}, \{\phi_{B+1}, \ldots, \phi_{2B}\}, \ldots, \{\phi_{B\lceil M/B \rceil-2B+1}, \ldots, \phi_M\}$ is valid. Partitions of the original set into $$\left\lfloor \frac{M}{B} \right\rfloor$$

subsets, all except possibly one of length B, (where $\lfloor \bullet \rfloor$ denotes a floor operation which maps a real number to a largest previous integer) may be used. It should be appreciated that the word "possibly" is used here because either all are of length B or all but one are of length B.

It will be appreciated by someone skilled in the art that other partitions into different numbers of subsets each with a possibly different number of elements also serve the purpose of the methods introduced in the present disclosure. For example, and more generally (i.e., independently of a block length B), partitions of the set of sampling functions $\phi$ into K non-overlapping and non-empty subsets of functions $\phi_1, \phi_2, \ldots, \phi_K$, each subset having $M_i$ elements, where $1 \leq i \leq K$ and $M_1+M_2+\ldots+M_K=M$ may also be used. The corresponding matrices of size $M_i \times N$, where $M_i << N$, each can have at least Q linearly independent columns and at most N−Q linearly dependent columns.

Since the reconstructed image and the sampling functions have the same number of pixels N, there is a one to one correspondence between the indices in the sampling functions and spatial locations in the image. From this correspondence, the index of the linearly independent columns is determined to be associated with the locations corresponding to the identified regions of interest, and the index of the linearly dependent columns is determined to be associated with the locations not corresponding to the identified regions of interest.

The value of B determines the difference in the quality of reconstruction of the ROI vs. non-ROI regions, larger values of B corresponding to larger differences. Typical values of B range from 2 to 8 although use of values outside that range may be used. In the multiple ROI case, each ROI may have an associated B value relative to the common non-ROI regions; regions with larger B values will be reconstructed at higher quality relative to regions with smaller B values. For example, if there are two ROIs of sizes $Q_1$ and $Q_2$ pixels respectively, and each associated with block lengths $B_1$ and $B_2$, then let B be the least common multiple between $B_1$ and $B_2$. Without loss of generality, assume $B_2 > B_1$ and $B_2 = kB_1$ for some integer k so that $B=B_2$. Each sub-matrix $\phi_1, \phi_2, \ldots, \phi_{\lceil M/B \rceil}$ with B rows and N columns will have: a sub-matrix with B rows and at least $Q_2$ columns with full rank (e.g., rank $B=B_2$), an index of the linearly independent columns in said sub-matrix being associated with locations corresponding to ROI number 2; a sub-matrix with B rows and at least $Q_1$ columns with rank $B_1=B/k$, an index of the columns in said sub-matrix being associated with locations corresponding to ROI number 1; and a sub-matrix with B rows and at most $N−Q_1−Q_2$ columns with rank 1, an index of the linearly dependent columns in said sub-matrix being associated with locations which do not correspond to either ROI. In the case where partitions of the set of sampling functions $\phi$ into K non-overlapping and non-empty subsets of functions $\phi_1, \phi_2, \ldots, \phi_K$, each subset having $M_i$ elements, larger values of $M_i$ will lead to larger differences in the quality of reconstruction of ROI vs. non-ROI regions.

Alternatively, the ordering can be such that, for sequences of sampling functions arranged in subsets all except possibly one of length B, subsets of sampling functions $\{\phi_1, \ldots, \phi_B\}$, $\{\phi_{B+1}, \ldots, \phi_{2B}\}$, $\{\phi_{B\lceil M/B \rceil - B+1}, \ldots, \phi_M\}$ are largely incoherent, sampling functions $\phi_i$ and $\phi_j$ in a given subset are largely uncorrelated for every i≠j only for pixels within ROIs as identified by the mask, and sampling functions $\phi_i$ and $\phi_j$ in a given subset are largely or even completely correlated for pixels outside the ROIs. In one embodiment, the sampling functions are obtained by adaptively modifying a set of largely uncorrelated sampling functions $\phi = \{\phi_1 \ldots, \phi_M\}$ (where $\phi$ is extracted, for example, from a random matrix with general independent rows or columns, or from a sub-Gaussian matrix,) in such a way that $\phi_i = \phi_i$ for $1 \leq i \leq M$ at locations associated with the ROIs and $\phi_i = \phi_k$ for $1 \leq i \leq M$ and some fixed $k \in [B\lceil i/B \rceil - B+1, B\lceil i/B \rceil] \cap [1,M]$, (where [●] denotes the ceiling operator which maps a real number to a smallest following integer) at locations not associated with the ROIs. In the general case where partitions of the set of sampling functions $\phi$ into K non-overlapping and non-empty subsets of functions $\phi_1, \phi_2, \ldots, \phi_K$, each subset having $M_i$ elements, where $1 \leq i \leq K$ and $M_1 + M_2 + \ldots + M_k = M$ are used, the sampling functions can be obtained by adaptively modifying a set of largely uncorrelated sampling functions $\phi = \{\phi_1 \ldots, \phi_M\}$ in such a way that $\phi_i = \phi_i$ for $1 \leq i \leq M$ at locations associated with the ROIs; for locations not associated with the ROIs, $\phi_i = \phi_k$ for $1 \leq i \leq M$, where k is such that when $M_1 + \ldots + M_{k-1} + 1 \leq i \leq M_1 + \ldots + M_k$, $k \in [M_1 + \ldots + M_{k-1} + 1, M_1 + \ldots + M_k]$.

In an alternative embodiment, the sampling functions are obtained by adaptively combining a set of largely uncorrelated sampling functions $\phi = \{\phi_1 \ldots, \phi_M\}$ and a set of B-blockwise largely correlated functions $\alpha = \{\alpha_1 \ldots, \alpha_M\}$. This is to say that blocks $\{\alpha_1, \ldots, \alpha_B\}$, $\{\alpha_{B+1}, \ldots, \alpha_{2B}\}$, ..., $\{\alpha_{B\lceil M/B \rceil - B+1}, \ldots, \alpha_M\}$ are largely incoherent, and functions $\alpha_i$ and $\alpha_j$ in a given subset are largely or fully correlated. The combination is performed in such a way that $\phi_i = \phi_i$ for $1 \leq i \leq M$ at locations associated with the ROIs and $\phi_i = \alpha_i$ for $1 \leq i \leq M$ and at locations not associated with the ROIs. A similar sampling function design strategy can be implemented in cases when partitions of the set of sampling functions $\phi$ into K non-overlapping and non-empty subsets of functions $\phi_1, \phi_2, \ldots, \phi_K$, each subset having $M_i$ elements are used. In this case, $\alpha$ is a set of $M_i$-block-wise largely correlated functions, where blocks $\{\alpha_1, \ldots, \alpha_{M1}\}$, $\{\alpha_{M1+1}, \ldots, \alpha_{M1+M2}\}$, ..., $\{\alpha_{M1-Mk+1}, \ldots, \alpha_M\}$ are largely incoherent, and functions $\alpha_i$ and $\alpha_j$ in a given subset are largely or possibly completely correlated. From these sets of functions, $\phi_i = \phi_i$ for $1 \leq i \leq M$ at locations associated with the ROIs as before; for locations not associated with the ROIs, $\phi_i = \alpha_i$ for $1 \leq i \leq M$.

There are several approaches to obtaining the set of sampling functions $\phi$ with the desired characteristics. In one embodiment, a set of largely uncorrelated sampling functions $\phi = \{\phi_1 \ldots, \phi_M\}$ extracted, for example, from a random matrix with general independent rows or from a sub-Gaussian matrix, are adaptively modified such that $\phi_i = \phi_i$ for $1 \leq i \leq M$ at locations associated with the ROIs and $\phi_i = \phi_k$ for $1 \leq i \leq M$ and a fixed $k \in [B\lceil i/B \rceil - B+1, B\lceil i/B \rceil] \cap [1,M]$, (where [●] denotes the ceiling operator which maps a real number to a smallest following integer) at locations not associated with the ROIs. In cases when partitions of the set of sampling functions $\phi$ into K non-overlapping and non-empty subsets of functions $\phi_1, \phi_2, \ldots, \phi_K$, each subset having $M_i$ elements are used, $\phi_i = \phi_i$ for $1 \leq i \leq M$ at locations associated with the ROIs; for locations not associated with the ROIs, $\phi_i = \phi_k$ for $1 \leq i \leq M$, where k is such that when $M_1 + \ldots + M_{k-1} + 1 \leq i \leq M_1 + \ldots + M_k$, $k \in [M_1 + \ldots + M_{k-1} + 1, M_1 + \ldots + M_k]$.

Measurements are obtained of the scene using a compressed sensing device which comprises, at least in part, a spatial light modulator configured according to a plurality of spatial patterns corresponding to the set of sampling functions. Each pattern focuses a portion of incoming light onto a detector which samples sequential measurements of light focused thereon. Each of the measurements is an inner product result $y_m = \langle x, \phi_m \rangle$, where x denotes an N-dimensional vector representing the N-pixel sampled version of the scene. A series of measurements comprises a sequence of projection coefficients corresponding to the inner product between that N-pixel sampled version of the scene and each of the sampling functions. An appearance of the scene is reconstructed from the sequence of projection coefficients after M inner products have been sampled, where M<<N, such that pixel locations associated with ROIs in the scene have a higher image quality when rendered relative to other pixels in the image.

The reason that this method is advantageous, particularly in the context of a DMD-based single pixel camera, has to do with the way a DMD module switching occurs. The switching capabilities of the array are limited so that instead of switching all individual micromirrors simultaneously, a group of micromirrors (e.g., a column, row or more generally, a cluster) has to be switched before the next group can be switched. Since single-pixel camera measurements cannot be taken until all micromirrors in the array have switched to their intended position, this sequential switching introduces undesirable delays and, consequently, reduces the effective sampling rate of the camera. In the present approach, since only a fraction of the micromirrors is switched at every cycle, the effect of the sequential switching mode on the sampling rate is ameliorated by a factor approximately equal to the ratio of the number of non-ROI pixels to the number of ROI pixels. Note that performing measurements with the ordered sampling functions obtained in the manner described above, achieves reconstruction of an ROI with increased quality relative to the rest of the image; additionally, and in the context of a DMD-based single pixel camera it also enables faster sampling rates due to the way a DMD module switching occurs, as stated above.

At step 106, configure a spatial light modulator to modulate incoming light according to spatial patterns corresponding to the set of ordered sampling functions.

At step 108, use a detector to sequentially sample the focused spatial pattern of light to obtain measurements of the scene, each comprising an inner product result $y_m = \langle x, \phi_m \rangle$, where x denotes an N-dimensional vector representing the N-pixel sampled version of the scene (i.e., the vectorized matrix representation of an image). The measurements comprise a sequence of projection coefficients corresponding to the scene.

At step 110, reconstruct a spatial appearance of an image of the scene from the sequence of projection coefficients after M inner products have been sampled. The reconstruction is such that pixels associated with the localized ROIs in the reconstructed image have a higher image quality, that more faithfully represents the appearance of the sampled scene, when rendered relative to other pixels in the image. This non-uniform quality of the reconstruction is enabled by the sampling scheme described above. Thereafter, in this embodiment, further processing stops.

It should be appreciated that the flow diagrams hereof are illustrative. One or more of the operations illustrated in the flow diagrams may be performed in a differing order. Other operations may be added, modified, enhanced, or consolidated. Variations thereof are intended to fall within the scope of the appended claims.

Example System Architecture

Figure 2:
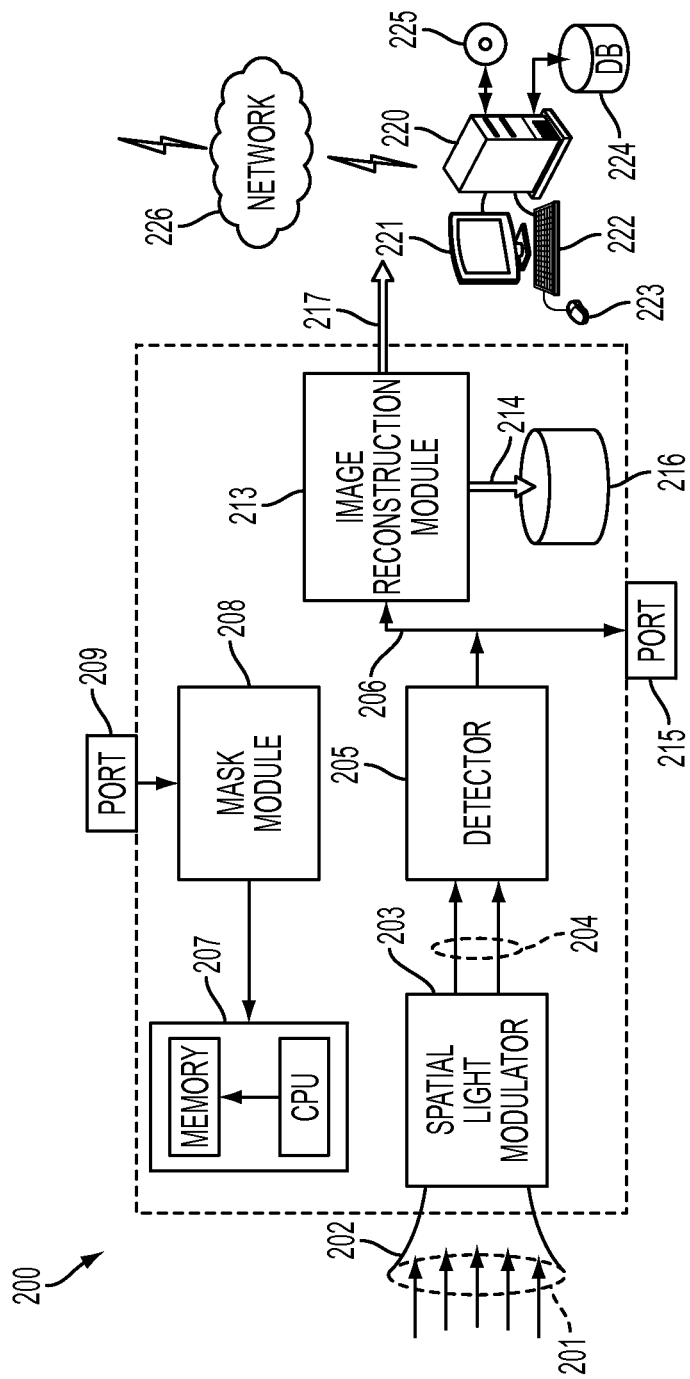
FIG. 2 shows one example system for performing scene reconstruction in accordance with the teachings hereof.

Reference is now being made to FIG. 2, which shows one example system for performing scene reconstruction in accordance with the teachings hereof.

In the system of FIG. 2, incoming light (collectively at 201) enters the compressed sensing system 200 through an aperture 202 and into a spatial light modulator (SLM) 203 which modulates the incoming light to produce a spatial pattern of light 204 which is focused on to detector 205. The detector measures a magnitude of an intensity of the spatial pattern focused thereon. Mask module 208 receives a mask using USB port 209, and provides the mask to a controller 207 shown comprising a processor (CPU) and a memory. The controller facilitates the configuration of the spatial light modulator to modulate incoming light. The detector outputs sequential measurements 206 which may be provided to USB port 215. Measurements obtained by the detector are communicated to image reconstruction module 213 wherein a spatial appearance of the scene is reconstructed from the measurements. The measurements and the reconstructed image 214 are communicated to storage device 216 and/or provided as output to workstation 220. Values, data, measurements, and results of any of the modules and processing units of the system 200 may be obtained or retrieved via communications bus 217.

Shown in communication with the system 200 is a workstation 220. The workstation is shown comprising a monitor 221, a keyboard 222, a mouse 223, a storage device 224, and a computer-readable media 225. The workstation is also placed in communication with one or more remote devices over network 226 using, for example, a network card. A user thereof may change or control the functionality of any of the modules and processing units comprising the system 200 using the workstation. An image of a scene can be displayed on the monitor and corrected and/or cropped. Masks can be generated using the workstation and communicated to the mask module 208. Measurements and values generated by the system may be displayed on the display device. Intensity values obtained by the detector may be modified by a user of the workstation. The values of the spatial pattern that controls the modulation of incoming light may further be communicated to the workstation and displayed on the monitor. A user can selectively identify regions of interest using, for example, a mouse. The user may further define the ordering of the set of sampling functions using the workstation. Localized regions of interest can be communicated to the mask module by the workstation. An operator of the workstation may modify the results generated by any of the modules or processing units of FIG. 2 as needed and/or re-direct the modified results back to the same or different modules for further processing or re-processing. It should be appreciated that the workstation has an operating system and other specialized software configured to display a variety of numeric values, text, scroll bars, pull-down menus with user selectable options, and the like, for entering, selecting, or modifying information displayed on the display device.

Various modules may designate one or more components which may, in turn, comprise software and/or hardware designed to perform the intended function. A plurality of modules may collectively perform a single function. Each module may have a specialized processor capable of executing machine-readable program instructions. A module may comprise a single piece of hardware such as an ASIC, electronic circuit, or special purpose processor. A plurality of modules may be executed by either a single special purpose computer system or a plurality of special purpose computer systems in parallel. Modules may include software/hardware which may further comprise an operating system, drivers, controllers, and other apparatuses some or all of which may be connected via a network.

Implementation Details

Figure 3:
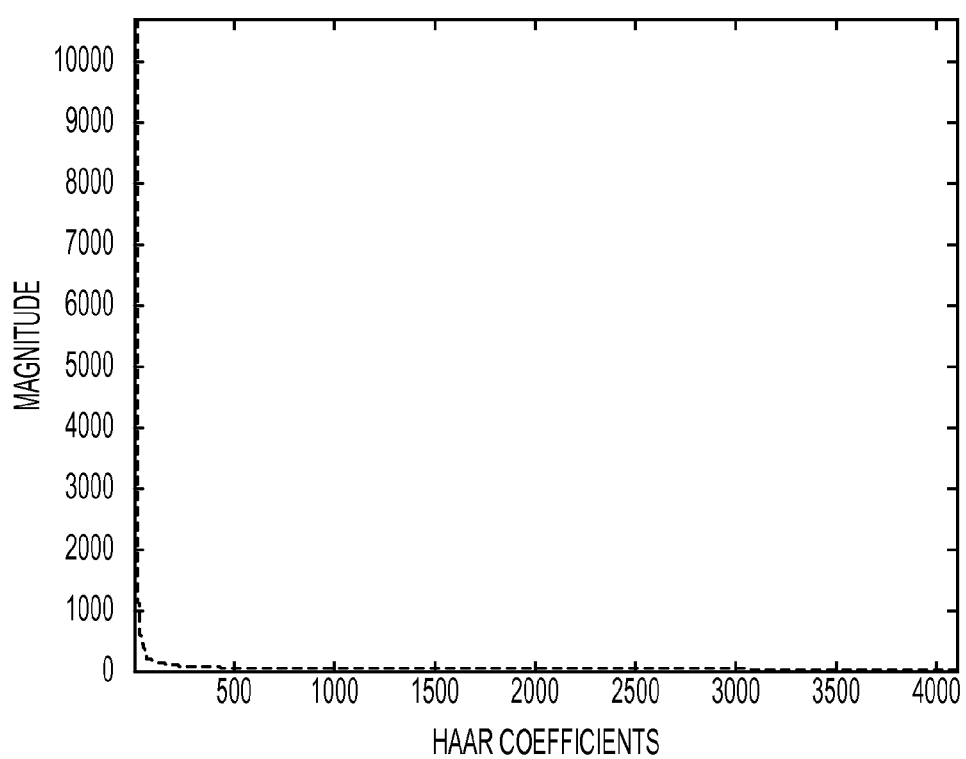
FIG. 3 shows the magnitude of the Haar coefficients of an image x used in the simulation of the present method in decreasing order, from largest to smallest.

Compressed sensing deals with signal recovery from highly incomplete information. A cornerstone of compressed sensing is that an N-dimensional sparse vector x[●] can be recovered from a small number M where M<<N of linear measurements $y_m = \langle x, \phi_m \rangle$, m=1, 2, ..., M, under a certain set of assumptions and by solving a convex optimization problem. In matrix form, y=φx where x=Ψs, with s being a sparse vector and Ψ defining a transformation to a domain where x is sparse; Ψ can be, for example, an orthonormal transform such as a DCT, wavelet or FFT transform. The number of non-zero entries in s determines the degree of sparseness K of x. For testing purposes, a set of binary pseudo-random sampling functions were used as sampling matrix φ of an image x, along with the assumption that each measurement (i.e., the inner product result) was uniformly quantized to a certain number of bits, and that the image was sparse in the Haar wavelet domain; note that assumptions of the image being sparse in other domains are anticipated. FIG. 3 shows the magnitude of the Haar coefficients of an image x used in the simulation of the present method in decreasing order, from largest to smallest. It can be seen that about 80% of the image energy is contained in the largest 500 Haar coefficients, while 99.9% of the image energy is contained in the largest 3000 coefficients.

The test image was sampled according to the teachings herein, and each of the measurements or inner products, quantized or digitized to a fixed bit depth. From the quantized set of measurements, we posed the recovery problem as an optimization $x = \mathrm{argmin}\{\|x\|_1\}$ subject to y=φx where, $\|●\|_1$ denotes the $l_1$ norm. It should be appreciated that this is only one of multiple ways to solve an inverse problem. Other approaches include exploiting the assumption that the gradient of the image is sparse, as well as building over-complete dictionaries in which the representation target image is sparse. The method described herein is equally adaptable to these techniques as well, as they rely on the use of sequences of sampling functions to perform the sensing.

An embodiment of the present system was used to reconstruct a spatial appearance of a scene comprising a 64×64 pixel image of the scene. A binary mask was used to identify an example ROI with dimensions 32×64 pixels. The table of FIG. 4 shows the overall mean squared error as well as the mean squared error between an image reconstructed from various numbers of samples and various block lengths B using the present method. That is, the set of sampling function was partitioned into subsets of the form $\{\phi_1, \ldots, \phi_B\}$, $\{\phi_{B+1}, \ldots, \phi_{2B}\}, \ldots, \{\phi_{B[M/B]-B+1}, \ldots, \phi_M\}$.

It can be seen by an examination of the results thereof that, as the block length increases, the quality of the reconstructed image as measured by the mean square error decreases; however, the quality of the reconstructed ROI suffers little for the range of B values tested, and, it is consistently better or on par relative to that yielded by the traditional compressed sensing approach. These results showcase the efficiency of the present method in preserving the quality of the targeted region of interest as the lengths of the blocks increase; we refer to this as improved encoding efficiency, since the quality of the reconstructed ROI is better than that yielded by traditional compressed sensing methods for a given number of measurements. Note that, in the context of a single pixel camera, use of the present method would result in increased switching frequencies: the larger the value of B, the faster the subsequent samples can be acquired.

One or more aspects of the teachings disclosed herein are intended to be incorporated in an article of manufacture. The above-disclosed features and functions or alternatives thereof, may be combined into other systems or applications. Presently unforeseen or unanticipated alternatives, modifications, variations, or improvements may become apparent and/or subsequently made by those skilled in the art and, further, may be desirably combined into other different systems or applications. Changes to the above-described embodiments may be made without departing from the spirit and scope of the invention. The teachings of any printed publications including patents and patent applications, are each separately hereby incorporated by reference in their entirety.

What is claimed is:

1. A method for reconstructing an N-pixel image of a scene captured using a compressed sensing device, the method comprising:

receiving a mask identifying at least one region of interest (ROI) of size Q pixels in the scene;

arranging a set of M sampling functions in an M×N matrix $\phi=\{\phi_1,\ldots,\phi_M\}$, whose $m^{th}$ row vector $\phi_m \in \mathbb{R}^N$ denotes the $m^{th}$ N-dimensional sampling function, and where M<<N;

partitioning said set of sampling functions into K non-overlapping and non-empty subsets of functions, each subset having $M_i$ elements, where $1 \leq i \leq K$ and $M_1+M_2+\ldots+M_k=M$;

arranging each resulting subset of functions in $M_i \times N$ matrices $\phi_1, \phi_2, \ldots, \phi_K$, each matrix having at least Q linearly independent columns and at most N−Q linearly dependent columns, an index of said linearly independent columns being associated with locations corresponding to said ROIs, and an index of said linearly dependent columns being associated with locations which do not correspond to said ROIs;

modulating, by a spatial light modulator, incoming light according to a plurality of spatial patterns corresponding to said ordered sampling functions, said modulated light being focused onto a detector of a compressed sensing device;

sampling, by said detector, sequential measurements of said modulated light focused thereon, each of said sampled measurements being an inner product result $y_m = <x,\phi_m>$, where x denotes an N-dimension vector representing the N-pixel sampled version of said scene, said measurements comprising a sequence of projection coefficients corresponding to said scene; and reconstructing a spatial appearance of said scene from said sequence of projection coefficients after M inner products have been sampled, said reconstructed image being such that pixels associated with said ROIs have a higher image quality when rendered relative to other pixels in said image.

2. The method of claim 1, wherein said partition is performed according to a block size B determining one of two possible partitions, $\phi_1, \phi_2, \ldots, \phi_{\lfloor M/B \rfloor}$ and $\phi_1, \phi_2, \ldots, \phi_{\lceil M/B \rceil}$ so that K equals one of $\lfloor M/B \rfloor$ and $\lceil M/B \rceil$, wherein each subset in the partition except possibly one has B elements.

3. The method of claim 2, wherein said partition according to a block size B is one of: $\{\phi_1, \ldots, \phi_B\}, \{\phi_{B+1}, \ldots, \phi_{2B}\}, \ldots, \{\phi_{B[M/B]-B+1}, \ldots, \phi_M\}$, and $\{\phi_1, \ldots, \phi_B\}, \{\phi_{B+1}, \ldots, \phi_{2B}\}, \ldots, \{\phi_{B[M/B]-2B+1}, \ldots, \phi_M\}$, where M>2B.

4. The method of claim 2, wherein said sampling functions are obtained by adaptively modifying a set of largely uncorrelated sampling functions $\phi=\{\phi_1 \ldots, \phi_M\}$ in such a way that $\phi_i = \phi_i$ for $1 \leq i \leq M$ at locations associated with said ROIs and $\phi_i = \phi_k$ for $1 \leq i \leq M$ and $k \in [B\lceil i/B \rceil - B+1, B\lceil i/B \rceil] \cap [1,M]$, where $\lceil \bullet \rceil$ denotes the ceiling operator which maps a real number to a smallest following integer at locations not associated with said ROIs.

5. The method of claim 2, wherein said sampling functions are obtained by adaptively combining a set of largely uncorrelated sampling functions $\phi=\{\phi_1 \ldots, \phi_M\}$ and a set of B-block-wise largely correlated functions $\alpha=\{\alpha_1 \ldots, \alpha_M\}$ in such a way that $\phi_i = \phi_i$ for $1 \leq i \leq M$ at indices associated with said ROIs, and $\phi_i = \alpha_i$ for $1 \leq i \leq M$ at indices not associated with said ROIs.

6. The method of claim 2, wherein different ROIs are associated with different subset lengths B.

7. The method of claim 1, wherein subsets of sampling functions $\phi_1, \phi_2, \ldots, \phi_K$ are largely incoherent, sampling functions $\phi_i$ and $\phi_j$ in a given subset are largely uncorrelated for every $i \neq j$ only for indices associated with said ROIs, and sampling functions $\phi_i$ and $\phi_j$ in a given subset are largely correlated for indices not associated with said ROIs.

8. The method of claim 7, wherein said sampling functions are obtained by adaptively modifying a set of largely uncorrelated sampling functions $\phi=\{\phi_1, \ldots, \phi_M\}$ in such a way that $\phi_i = \phi_i$ for $1 \leq i \leq M$ at locations associated with said ROIs, and $\phi_i = \phi_k$ for $1 \leq i \leq M$ where k is such that when $M_1 + \ldots + M_{k-1} + 1 \leq i \leq M_1 + \ldots + M_k$, $k \in [M_1 + \ldots + M_{k-1}+1, M_1 + \ldots + M_k]$ at locations not associated with said ROIs.

9. The method of claim 1, wherein said sampling functions are generated based on an output of a random number generator, wherein generated values of sampling functions associated with said ROIs update at a different rate than those not associated with said ROIs, said output of said random number generator being passed through a deterministic function in order to obtain samples from different distributions.

10. The method of claim 1, wherein said spatial light modulator comprises any of: a digital micromirror device, a transmissive liquid crystal, and reflective liquid crystal on silicon.

11. The method of claim 1, further comprising processing an image of said scene to identify said ROIs using any of: pixel classification, object identification, facial recognition, color, texture, spatial features, spectral information, pattern recognition, motion detection, foreground detection, and a user input.

12. The method of claim 1, further comprising processing an image of said scene to generate said mask wherein pixels associated with said ROI as being active and pixels outside said ROI as being inactive.

13. The method of claim 1, wherein said mask is updated in real-time in response to a location of any of said ROIs changing over time.

14. A compressed sensing system for reconstructing an N-pixel image of a scene captured using a compressed sensing device, the system comprising:

a mask identifying at least one Q-pixel region of interest (ROI) in a scene;

a spatial light modulator for modulating incoming light according to spatial patterns corresponding to a set of M sampling functions arranged in an M×N matrix $\phi=\{\phi_1, \ldots, \phi_M\}$, whose $m^{th}$ row vector $\phi_m \in \mathbb{R}^N$ denotes the $m^{th}$ N-dimensional sampling function, and where M<<N, said set of sampling functions being partitioned into K non-overlapping and non-empty subsets of functions, each subset having $M_i$ elements, where $1 \leq i \leq K$ and $M_1+M_2+\ldots+M_k=M$, each resulting subset of functions being arranged in $M_i \times N$ matrices $\phi_1, \phi_2, \ldots, \phi_K$, each matrix having at least Q linearly independent columns and at most N−Q linearly dependent columns, an index of said linearly independent columns being associated with locations corresponding to said ROIs, and an index of said linearly dependent columns being associated with locations which do not correspond to said ROIs;

a detector of a compressed sensing device, said detector sampling sequential measurements of said modulated light focused thereon, each of said sampled measurements being an inner product result $y_m = \langle x, \phi_m \rangle$, where x denotes an N-dimension vector representing the N-pixel sampled version of a scene, said measurements comprising a sequence of projection coefficients corresponding to said scene; and a processor executing machine readable program instructions for reconstructing a spatial appearance of said scene from said sequence of projection coefficients after M inner products have been sampled, said reconstructed image being such that pixels associated with said ROIs have a higher image quality when rendered relative to other pixels in said image.

15. The system of claim 14, wherein said partition is performed according to a block size B determining one of two possible partitions, $\phi_1, \phi_2, \ldots, \phi_{\lceil M/B \rceil}$ and $\phi_1, \phi_2, \ldots, \phi_{\lceil M/B \rceil}$ so that K equals one of $\lceil M/B \rceil$ and $\lceil M/B \rceil$, wherein each subset in the partition except possibly one has B elements.

16. The system of claim 15 wherein said partition according to a block size B is one of: $\{\phi_1, \ldots, \phi_B\}$, $\{\phi_{B+1}, \ldots, \phi_{2B}\}, \ldots, \{\phi_{B\lceil M/B \rceil-B+1}, \ldots, \phi_M\}$, and $\{\phi_1, \ldots, \phi_B\}$, $\{\phi_{B+1}, \ldots, \phi_{2B}\}, \ldots, \{\phi_{B\lceil M/B \rceil-2B+1}, \ldots, \phi_M\}$, where M>2B.

17. The system of claim 15, wherein said sampling functions are obtained by adaptively modifying a set of largely uncorrelated sampling functions $\phi = \{\phi_1 \ldots, \phi_M\}$ in such a way that $\phi_i = \phi_i$ for $1 \leq i \leq M$ at locations associated with said ROIs and $\phi_i = \phi_k$ for $1 \leq i \leq M$ and $k \in [B\lceil i/B \rceil - B+1, B\lceil i/B \rceil] \cap [1, M]$, where [●] denotes the ceiling operator which maps a real number to a smallest following integer at locations not associated with said ROIs.

18. The system of claim 15, wherein said sampling functions are obtained by adaptively combining a set of largely uncorrelated sampling functions $\phi = \{\phi_1 \ldots, \phi_M\}$ and a set of B-block-wise largely correlated functions $\alpha = \{\alpha_1 \ldots, \alpha_M\}$ in such a way that $\phi_i = \phi_i$ for $1 \leq i \leq M$ at indices associated with said ROIs, and $\phi_i = \alpha_i$ for $1 \leq i \leq M$ at indices not associated with said ROIs.

19. The system of claim 14, wherein subsets of sampling functions $\phi_1, \phi_2, \ldots, \phi_K$ are largely incoherent, sampling functions $\phi_i$ and $\phi_j$ in a given subset are largely uncorrelated for every i≠j only for indices associated with said ROIs, and sampling functions $\phi_i$ and $\phi_j$ in a given subset are largely correlated for indices not associated with said ROIs.

20. The system of claim 19, wherein said sampling functions are obtained by adaptively modifying a set of largely uncorrelated sampling functions $\phi = \{\phi_1 \ldots, \phi_M\}$ in such a way that $\phi_i = \phi_i$ for $1 \leq i \leq M$ at locations associated with said ROIs, and $\phi_i = \phi_k$ for $1 \leq i \leq M$ where k is such that when $M_1 + \ldots + M_{k-1} + 1 \leq i \leq M_1 + \ldots + M_k$, $k \in [M_1 + \ldots + M_{k-1} + 1, M_1 + \ldots + M_k]$ at locations not associated with said ROIs.

21. The system of claim 14, wherein said sampling functions are generated based on an output of a random number generator, wherein generated values of sampling functions associated with said ROIs update at a different rate than those not associated with said ROIs, said output of said random number generator being passed through a deterministic function in order to obtain samples from different distributions.

22. The system of claim 14, wherein said spatial light modulator comprises any of: a digital micromirror device, a transmissive liquid crystal, and reflective liquid crystal on silicon.

23. The system of claim 14, further comprising processing an image of said scene to identify said ROIs using any of: pixel classification, object identification, facial recognition, color, texture, spatial features, spectral information, pattern recognition, motion detection, foreground detection, and a user input.

24. The system of claim 14, further comprising processing an image of said scene to generate said mask wherein pixels associated with said ROI as being active and pixels outside said ROI as being inactive.

25. The system of claim 14, wherein different ROIs are associated with different subset lengths B.

* * * * *